(12) United States Patent
Hirahara

(10) Patent No.: US 9,918,415 B2
(45) Date of Patent: Mar. 13, 2018

(54) SHIELD STRUCTURE FOR STORING ELECTRONIC CIRCUIT, AND ELECTRONIC DEVICE

(71) Applicant: KYOCERA Document Solutions Inc., Osaka-shi, Osaka (JP)

(72) Inventor: Kazuhisa Hirahara, Osaka (JP)

(73) Assignee: KYOCERA Document Solutions Inc., Osaka-shi, Osaka (JP)

( * ) Notice: Subject to any disclaimer, the term of this patent is extended or adjusted under 35 U.S.C. 154(b) by 0 days.

(21) Appl. No.: 15/619,277

(22) Filed: Jun. 9, 2017

(65) Prior Publication Data

US 2017/0367224 A1    Dec. 21, 2017

(30) Foreign Application Priority Data

Jun. 20, 2016 (JP) ................................. 2016-121465

(51) Int. Cl.
*H05K 9/00* (2006.01)
(52) U.S. Cl.
CPC ................................. *H05K 9/0049* (2013.01)
(58) Field of Classification Search
None
See application file for complete search history.

(56) References Cited

U.S. PATENT DOCUMENTS

| | | | | |
|---|---|---|---|---|
| 5,886,879 A * | 3/1999 | Matuschik | ............ | H05K 9/006 174/372 |
| 6,552,261 B2 * | 4/2003 | Shlahtichman | ...... | H05K 9/0032 174/363 |
| 6,992,901 B1 * | 1/2006 | Hung | ................... | H05K 9/0009 174/385 |
| 7,916,500 B2 * | 3/2011 | Shi | ........................ | H05K 9/0032 174/350 |
| 8,247,707 B2 * | 8/2012 | Li | ............................ | H05K 9/00 174/377 |
| 8,520,398 B2 * | 8/2013 | Zhao | ..................... | H05K 9/0039 361/719 |
| 9,374,933 B2 * | 6/2016 | Huang | ................. | H05K 9/0032 |
| 9,462,732 B2 * | 10/2016 | Robinson | ............. | H05K 9/0032 |
| 9,497,878 B2 * | 11/2016 | Huang | ................. | H05K 7/1417 |

(Continued)

FOREIGN PATENT DOCUMENTS

JP    2014075611 A    4/2014

*Primary Examiner* — Xanthia C Cunningham
(74) *Attorney, Agent, or Firm* — Alleman Hall Creasman & Tuttle LLP

(57) ABSTRACT

A shield structure includes a main body portion and a lid portion. An electronic circuit is stored in the main body portion. The lid portion is attached to the main body portion in a detachable manner, and includes a first contact portion. The main body portion includes an opening portion, a second contact portion, and a pressurizing portion. When the first contact portion moves in a direction perpendicular to a direction of the lid portion attached to the main body portion, in a state of being inserted in the opening portion, the first contact portion is elastically deformed in a first direction by contacting the second contact portion and comes into pressure contact with the second contact portion. When the first contact portion is inserted in the opening portion, the pressurizing portion contacts and pressurizes the first contact portion in a second direction opposite to the first direction.

6 Claims, 6 Drawing Sheets

(56) References Cited

U.S. PATENT DOCUMENTS

| | | | | |
|---|---|---|---|---|
| 9,609,763 | B2* | 3/2017 | Gerst | H05K 5/0013 |
| 2002/0126466 | A1* | 9/2002 | Suzuki | H05K 9/006 |
| | | | | 361/818 |
| 2004/0256128 | A1* | 12/2004 | King | H05K 9/0033 |
| | | | | 174/382 |
| 2005/0219831 | A1* | 10/2005 | Vinokor | H05K 9/0032 |
| | | | | 361/797 |
| 2008/0310139 | A1* | 12/2008 | English | H05K 9/0032 |
| | | | | 361/818 |
| 2010/0061066 | A1* | 3/2010 | Guan | H05K 9/0026 |
| | | | | 361/752 |
| 2012/0012381 | A1* | 1/2012 | Cao | H05K 9/0007 |
| | | | | 174/377 |
| 2012/0044663 | A1* | 2/2012 | Lu | H05K 9/0026 |
| | | | | 361/818 |
| 2013/0250540 | A1* | 9/2013 | Hou | H05K 9/0032 |
| | | | | 361/818 |
| 2014/0043785 | A1* | 2/2014 | Huang | H05K 9/0032 |
| | | | | 361/816 |
| 2014/0071635 | A1* | 3/2014 | Werner | H05K 3/30 |
| | | | | 361/748 |
| 2014/0286009 | A1* | 9/2014 | Hamilton | F21V 23/00 |
| | | | | 362/249.02 |
| 2016/0270270 | A1* | 9/2016 | Madsen | H04B 1/08 |

* cited by examiner

SHIELD STRUCTURE FOR STORING ELECTRONIC CIRCUIT, AND ELECTRONIC DEVICE

INCORPORATION BY REFERENCE

This application is based upon and claims the benefit of priority from the corresponding Japanese Patent Application No. 2016-121465 filed on Jun. 20, 2016, the entire contents of which are incorporated herein by reference.

BACKGROUND

The present disclosure relates to a shield structure, and an electronic device having a shield structure.

An electronic device such as a printer includes an electronic circuit that includes electronic parts such as a CPU. The electronic circuit may cause a malfunction due to a noise radiated from another electronic device. In addition, a noise radiated from the electronic circuit may influence an operation of another electronic device. As a result, the electronic device may have a shield structure.

The shield structure protects the electronic circuit stored in its inside by shielding it from the noise radiated from outside, and restricts the noise radiated from the electronic circuit in its inside from leaking outside. For example, the shield structure includes a main body portion and a lid portion, wherein the main body portion stores the electronic circuit, and the lid portion is attached to the main body portion in a detachable manner. Here, there is known, as a conventional technology, a shield structure in which a connection portion is provided on the lid portion, wherein the connection portion electrically connects the main body portion and the lid portion by contacting the main body portion in a state of being biased toward the main body portion.

SUMMARY

A shield structure according to an aspect of the present disclosure includes a main body portion and a lid portion. The main body portion is conductive and in the main body portion, an electronic circuit is stored. The lid portion is conductive and attached to the main body portion in a detachable manner. One of the main body portion and the lid portion includes a first contact portion, and the other includes an opening portion, a second contact portion, and a pressurizing portion. The first contact portion can be inserted in the opening portion. The second contact portion is provided in an edge portion of the opening portion. The pressurizing portion is configured to pressurize the first contact portion inserted in the opening portion. When the first contact portion moves in a direction perpendicular to an attachment direction of the lid portion attached to the main body portion, in a state of being inserted in the opening portion, the first contact portion is elastically deformed in a first direction by contacting the second contact portion and comes into pressure contact with the second contact portion. During a period from an insertion of the first contact portion in the opening portion until the first contact portion contacts the second contact portion, the pressurizing portion contacts and pressurizes the first contact portion in a second direction that is opposite to the first direction.

An electronic device according to another aspect of the present disclosure includes the shield structure and the electronic circuit.

This Summary is provided to introduce a selection of concepts in a simplified form that are further described below in the Detailed Description with reference where appropriate to the accompanying drawings. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

DETAILED DESCRIPTION

The following describes an embodiment of the present disclosure with reference to the attached drawings for the understanding of the present disclosure. It should be noted that the following embodiment is an example of a specific embodiment of the present disclosure and should not limit the technical scope of the present disclosure.

[Outlined Configuration of Image Forming Apparatus 10]

Figure 1:
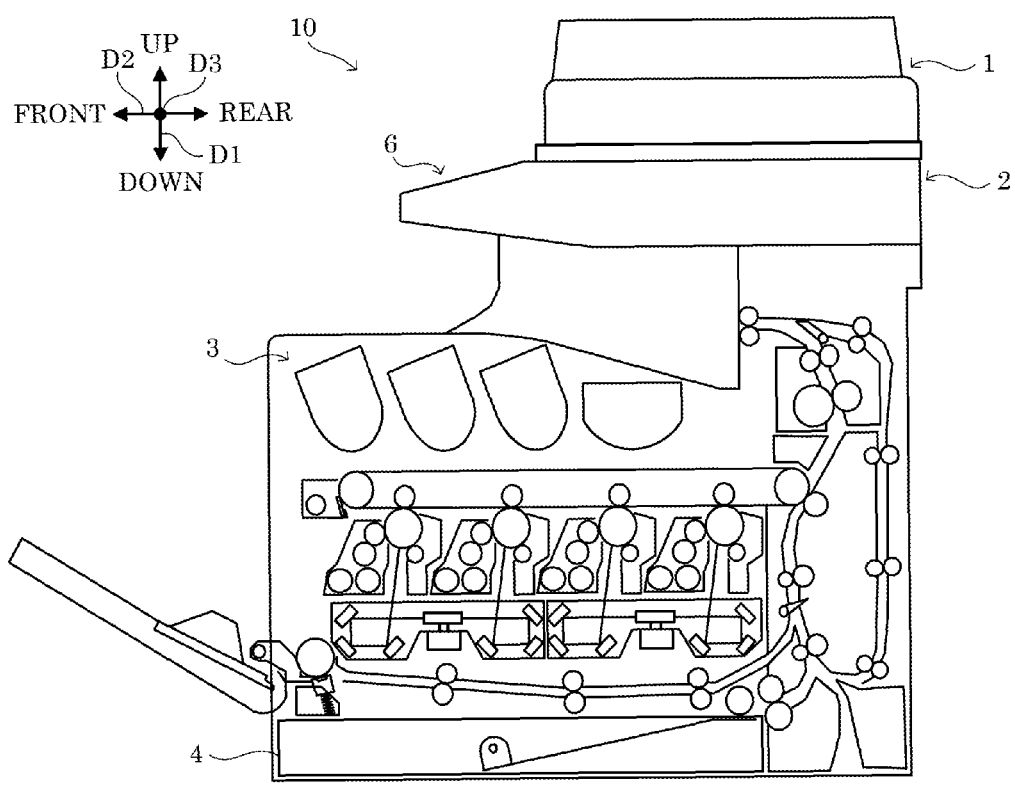
FIG. 1 is a diagram showing a configuration of an image forming apparatus according to an embodiment of the present disclosure.
Figure 2:
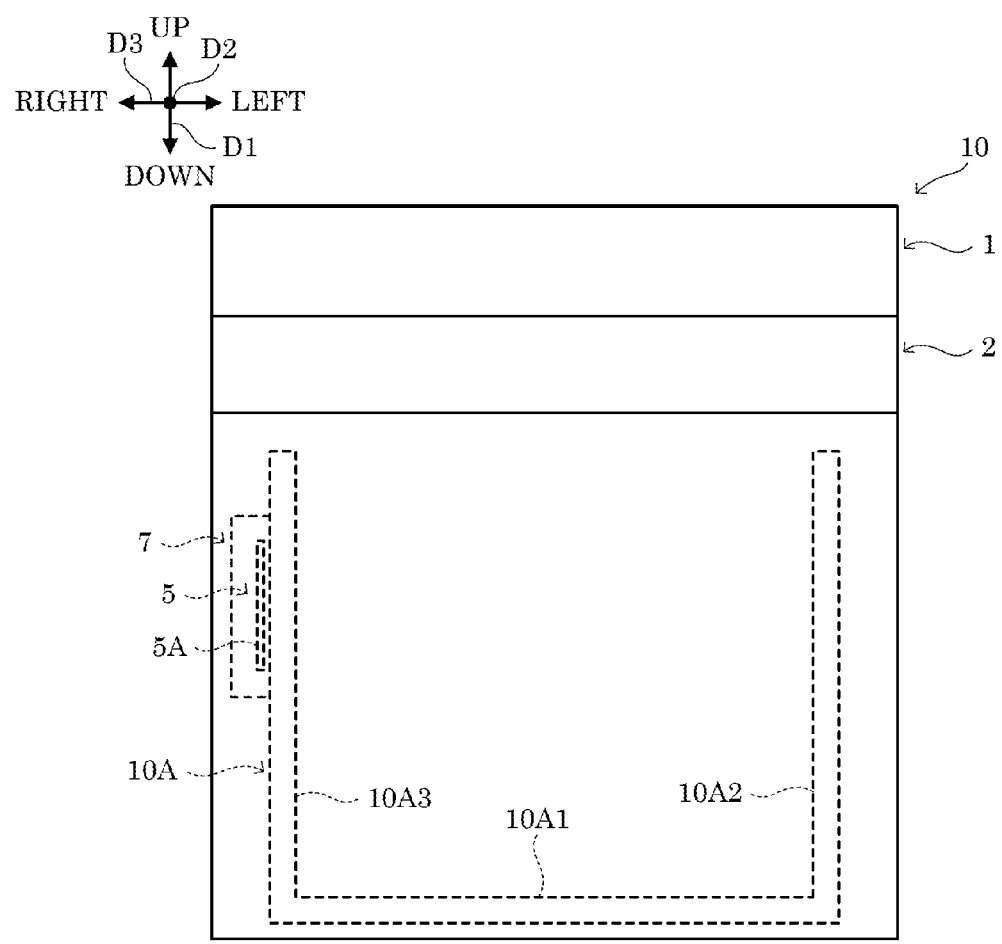
FIG. 2 is a diagram showing a configuration of the image forming apparatus according to the embodiment of the present disclosure.

First, an outlined configuration of an image forming apparatus 10 according to an embodiment of the present disclosure is described with reference to FIG. 1 and FIG. 2. Here, FIG. 1 is a cross-sectional view showing the configuration of the image forming apparatus 10. FIG. 2 is a diagram showing a configuration of the rear surface of the image forming apparatus 10.

It is noted that, for the sake of convenience, directions are defined as follows. An up-down direction D1 is defined as the vertical direction in a state where the image forming apparatus 10 is installed usably (the state shown in FIG. 1). A front-rear direction D2 is defined on a basis that the left side of the image forming apparatus 10 shown in FIG. 1 is a front side (front surface). Furthermore, a left-right direction D3 is defined based on the image forming apparatus 10 in the installed state viewed from the front side.

The image forming apparatus 10 is a multifunction peripheral having a plurality of functions such as a scan function for reading image data from a document sheet, a print function for forming an image based on image data, a facsimile function, and a copy function. Here, the image forming apparatus 10 is an example of an electronic device of the present disclosure. It is noted that the present disclosure is applicable to electronic devices such as a scanner device, a printer device, a facsimile device, a copier, a personal computer, a television, an air conditioner, a washing machine, and a microwave oven.

As shown in FIG. 1 and FIG. 2, the image forming apparatus 10 includes an ADF 1, an image reading portion 2, an image forming portion 3, a sheet feed portion 4, a control portion 5, an operation/display portion 6, and a shield case 7.

The ADF 1 is an automatic document feeding device that includes a document sheet setting portion, a plurality of conveyance rollers, a document sheet pressing, and a sheet discharge portion, and conveys a document sheet so that it is read by the image reading portion 2. The image reading portion 2 includes a document sheet table, a light source, a plurality of mirrors, an optical lens, and a CCD (Charge Coupled Device), and is configured to read image data from a document sheet.

The image forming portion 3 is configured to execute an image forming process (printing process) in which to form a color or monochrome image by the electrophotographic system based on image data read by the image reading portion 2, or image data input from an external information processing apparatus such as a personal computer. Specifically, the image forming portion 3 includes a plurality of image forming units corresponding to C (cyan), M (magenta), Y (yellow), and K (black), a laser scanning unit (LSU), an intermediate transfer belt, a secondary transfer roller, a fixing device, and a sheet discharge tray. In the image forming portion 3, a color or monochrome image is formed on a sheet supplied from the sheet feed portion 4, and the sheet with the image formed thereon is discharged to the discharge tray.

The operation/display portion 6 includes a display portion and an operation portion, wherein the display portion includes a liquid crystal display or the like, and displays various types of information in response to control instructions from the control portion 5, and the operation portion is composed of, for example, operation keys or a touch panel that inputs various types of information to the control portion 5 in response to user operations.

The control portion 5 comprehensively controls the image forming apparatus 10. For example, the control portion 5 is an electronic circuit including electronic parts such as a CPU, a ROM, a RAM, and an EEPROM. The control portion 5 is implemented on a control board 5A shown in FIG. 2. Here, the control portion 5 is an example of the electronic circuit of the present disclosure.

The CPU is a processor that executes various calculation processes. The ROM is a nonvolatile storage medium in which various information such as control programs for causing the CPU to execute various processes are stored in advance. The RAM is a volatile storage medium, and the EEPROM is a nonvolatile storage medium. The RAM and the EEPROM are used as temporary storage memory (working area) for the various processes executed by the CPU. In the control portion 5, the CPU executes the various control programs stored in advance in the ROM. This allows the image forming apparatus 10 to be controlled comprehensively by the control portion 5. It is noted that the control portion 5 may be formed as an electronic circuit such as an integrated circuit (ASIC), and may be a control portion provided independently of a main control portion that comprehensively controls the image forming apparatus 10.

The control portion 5 may cause a malfunction due to an electromagnetic noise (hereinafter, merely referred to as a "noise") radiated from an external electronic device. In addition, a noise radiated from the control portion 5 may influence an operation of an external electronic device. For these reasons, the control portion 5 is stored in the shield case 7.

Figure 3:
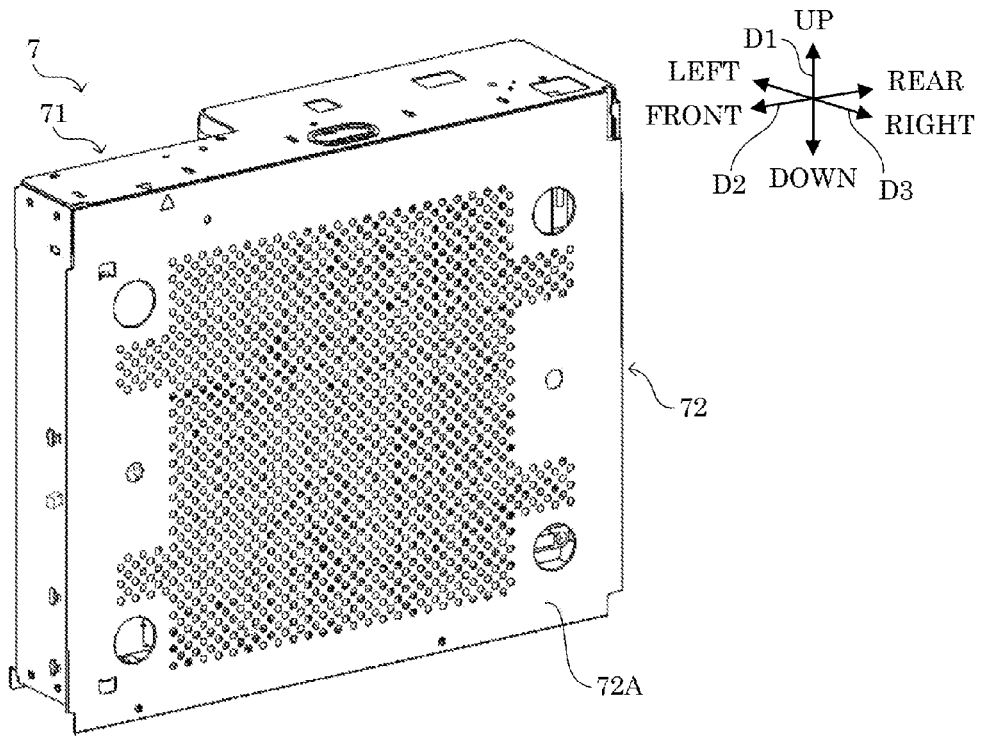
FIG. 3 is a diagram showing a configuration of a shield case of the image forming apparatus according to the embodiment of the present disclosure.
Figure 4:
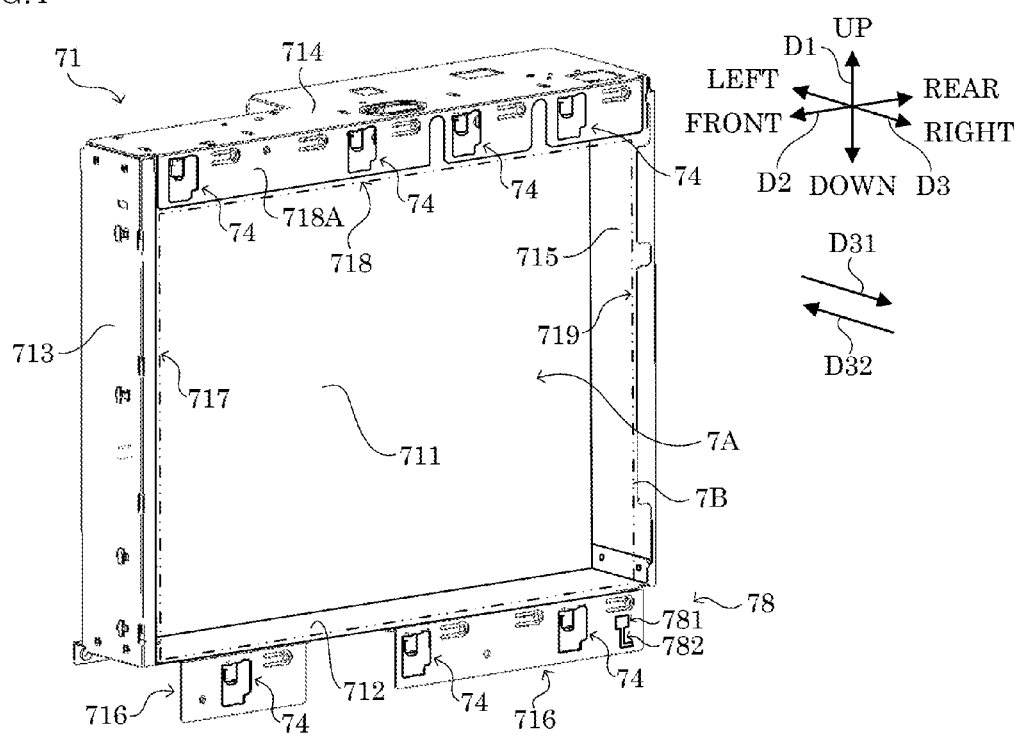
FIG. 4 is a diagram showing a configuration of a main body portion of the shield case of the image forming apparatus according to the embodiment of the present disclosure.
Figure 5:
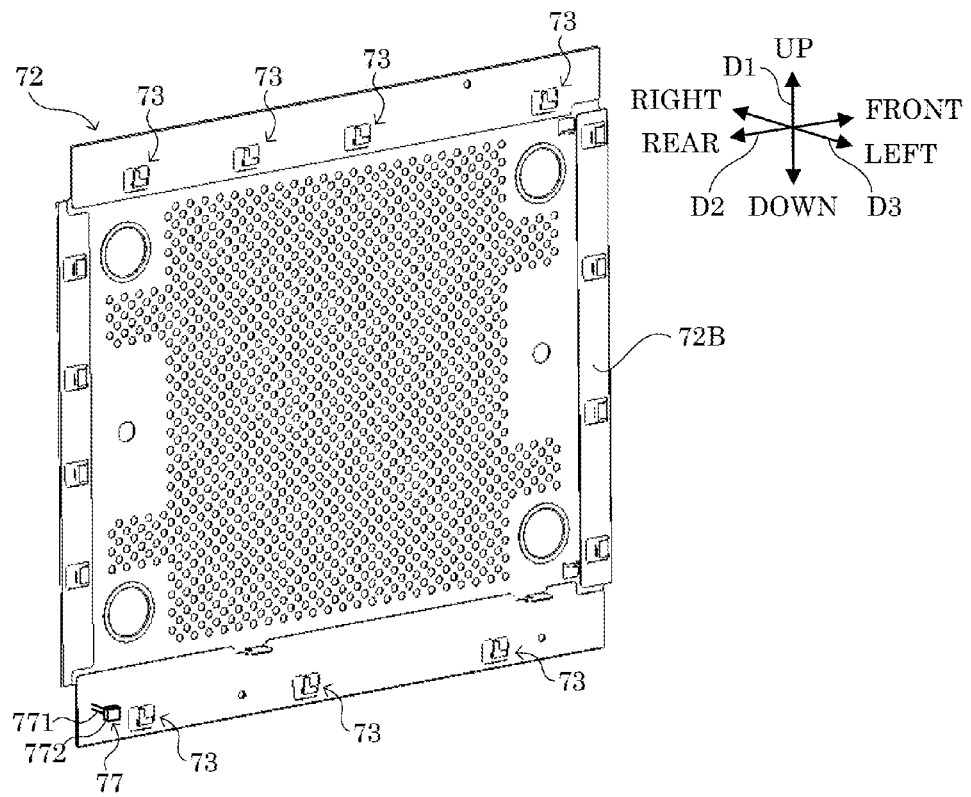
FIG. 5 is a diagram showing a configuration of a lid portion of the shield case of the image forming apparatus according to the embodiment of the present disclosure.
Figure 6:
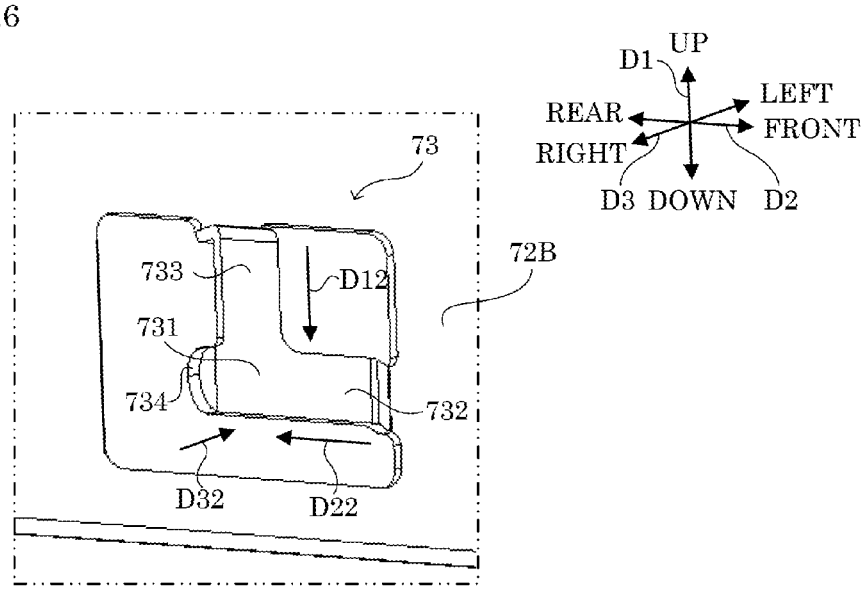
FIG. 6 is a diagram showing a partial configuration of the lid portion of the shield case of the image forming apparatus according to the embodiment of the present disclosure.
Figure 7:
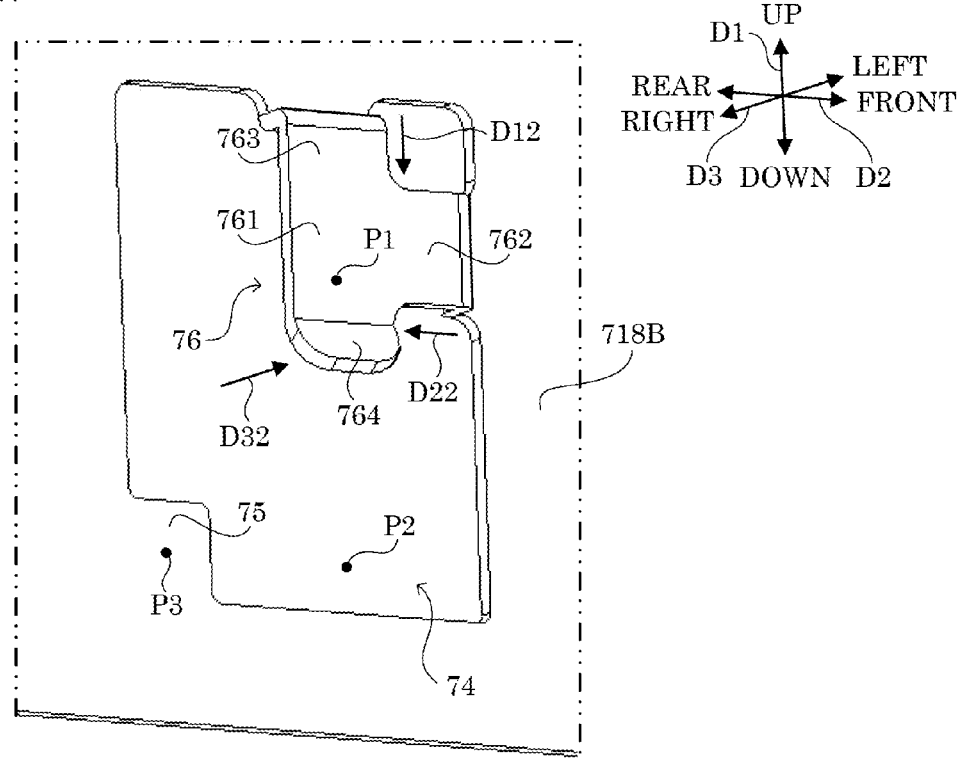
FIG. 7 is a diagram showing a partial configuration of the main body portion of the shield case of the image forming apparatus according to the embodiment of the present disclosure.

Next, a description is given of the shield case 7 with reference to FIG. 2 to FIG. 7. Here, FIG. 3 is a perspective view showing a configuration of the shield case 7. FIG. 4 is a perspective view showing a configuration of a main body portion 71. FIG. 5 is a perspective view showing a configuration of a lid portion 72. FIG. 6 is a perspective view showing a configuration of a first contact portion 73. FIG. 7 is a perspective view showing a configuration of an opening portion 74, a second contact portion 75, and a pressurizing portion 76.

It is noted that in FIG. 3 to FIG. 7, the up-down direction D1, the front-rear direction D2, and the left-right direction D3 are indicated on a basis of the shield case 7 that is in a state of being attached to the image forming apparatus 10. In addition, in FIG. 3, a front surface 72A of the lid portion 72 is shown, whereas in FIG. 5 and FIG. 6, a rear surface 72B of the lid portion 72 is shown. Furthermore, in FIG. 4, a front surface 718A of a lid support portion 718 is shown, whereas in FIG. 7, a rear surface 718B of the lid support portion 718 is shown. In addition, in FIG. 4, an area encircled by a two-dot chain line represents an opening 7B.

The shield case 7 protects the control portion 5 stored in its inside by shielding it from the noise radiated from an external electronic device, and restricts the noise radiated from the control portion 5 in its inside from leaking outside. For example, as shown in FIG. 3, the shield case 7 is in the shape of a rectangular parallelepiped, and includes a storage space 7A (see FIG. 4) in which the control portion 5 is stored. Here, the shield case 7 is an example of the shield structure of the present disclosure.

For example, the image forming apparatus 10 includes a frame 10A made of a metal. For example, as shown in FIG. 2, the frame 10A includes a bottom plate portion 10A1 and a pair of side wall portions 10A2 and 10A3, wherein the bottom plate portion 10A1 is provided on the bottom of the image forming apparatus 10, and the pair of side wall portions 10A2 and 10A3 are erected at opposite sides of the image forming apparatus 10 opposite to each other in the left-right direction D3. The frame 10A is electrically connected to the ground of the image forming apparatus 10. For example, as shown in FIG. 2, the shield case 7 is provided on the side wall portion 10A3 of the frame 10A. It is noted that the shield case 7 may be provided at another location in the image forming apparatus 10.

As shown in FIG. 3, the shield case 7 includes the main body portion 71 and the lid portion 72.

As shown in FIG. 4, the main body portion 71 includes a bottom plate portion 711, side wall portions 712-715, and lid support portions 716-719. The main body portion 71 is conductive. For example, the main body portion 71 is formed from a sheet metal member.

The control portion 5 is provided on the bottom plate portion 711. For example, the bottom plate portion 711 includes a support portion (not shown) that supports the control board 5A. In addition, the bottom plate portion 711 is attached to the frame 10A. For example, the bottom plate portion 711 is attached to the frame 10A by screws. For example, as shown in FIG. 4, the bottom plate portion 711 is formed in the shape of a rectangle.

As shown in FIG. 4, the side wall portions 712-715 are erected at ends of the bottom plate portion 711. The bottom plate portion 711 and the side wall portions 712-715 define the storage space 7A that is opened in one direction.

As shown in FIG. 4, the lid support portions 716-719 project inward or outward of the storage space 7A from the top of the side wall portions 712-715. Specifically, the lid support portions 716-719 are provided as flat plates parallel to the bottom plate portion 711. For example, the lid support portion 716 is formed by bending a part of the top of the side wall portion 712 toward the outside of the storage space 7A. In addition, the lid support portion 717 is formed by bending a part of the top of the side wall portion 713 toward the inside of the storage space 7A. Furthermore, the lid support portion 718 is formed by bending a part of the top of the side wall portion 714 toward the inside of the storage space 7A. In addition, the lid support portion 719 is formed by bending a part of the top of the side wall portion 715 toward the inside of the storage space 7A. The lid support portions 716-719 support the lid portion 72 attached to the main body portion 71, by coming into contact with the rear surface 72B of the lid portion 72.

The lid portion 72 closes the storage space 7A of the main body portion 71 by closing the opening 7B that is formed to be surrounded by the top of the side wall portion 712 and the lid support portions 717-719. The lid portion 72 is conductive. For example, the lid portion 72 is formed in the shape of a rectangle that is wider than the bottom plate portion 711, from a sheet metal member having lower rigidity than the main body portion 71. It is noted that as shown in FIG. 3 and FIG. 5, the lid portion 72 has a plurality of vent holes.

The lid portion 72 is attached to the main body portion 71 in a detachable manner. For example, as shown in FIG. 5 and FIG. 6, the lid portion 72 includes the first contact portions 73. On the other hand, as shown in FIG. 4 and FIG. 7, the main body portion 71 includes the opening portions 74, the second contact portions 75, and the pressurizing portions 76. For example, the first contact portions 73 are integrally formed with the lid portion 72. In addition, the opening portions 74, the second contact portions 75, and the pressurizing portions 76 are integrally formed with the main body portion 71.

As shown in FIG. 5 and FIG. 6, the first contact portions 73 are provided on the rear surface 72B of the lid portion 72. For example, in the image forming apparatus 10, as shown in FIG. 5, four first contact portions 73 are provided in an upper edge portion of the rear surface 72B of the lid portion 72. In addition, three first contact portions 73 are provided in a lower edge portion of the rear surface 72B of the lid portion 72. It is noted that the first contact portions 73 may be provided at other positions in the rear surface 72B of the lid portion 72. In addition, an arbitrary number of the first contact portions 73 may be provided in the rear surface 72B of the lid portion 72.

For example, as shown in FIG. 6, each of the first contact portions 73 includes a pressure contact portion 731, a first support portion 732, a second support portion 733, and a first claw portion 734.

The pressure contact portion 731 is provided separated from the rear surface 72B of the lid portion 72 by a predetermined first distance, and comes into pressure contact with the second contact portion 75. For example, the pressure contact portion 731 comes into pressure contact with the second contact portion 75 at a contact position P3 shown in FIG. 7 (see FIG. 10). For example, the first distance is shorter than a thickness of the second contact portion 75 in the left-right direction D3. It is noted that the first distance is set to an appropriate value so that the contact pressure between the first contact portion 73 and the second contact portion 75 at the contact position P3, has a desired strength.

As shown in FIG. 6, the first support portion 732 extends in a rearward direction D22 and supports the pressure contact portion 731. For example, the first support portion 732 projects from the rear surface 72B of the lid portion 72, and then extends in the rearward direction D22 such that its extended end supports the pressure contact portion 731.

As shown in FIG. 6, the second support portion 733 extends in a downward direction D12 and supports the pressure contact portion 731. For example, the second support portion 733 projects from the rear surface 72B of the lid portion 72, and then extends in the downward direction D12 such that its extended end supports the pressure contact portion 731. It is noted that the second support portion 733 may extend in a direction that is perpendicular to a leftward direction D32 and intersects with the rearward direction D22 at an angle other than perpendicular. Here, the downward direction D12 is an example of the fifth direction of the present disclosure.

Figure 9:
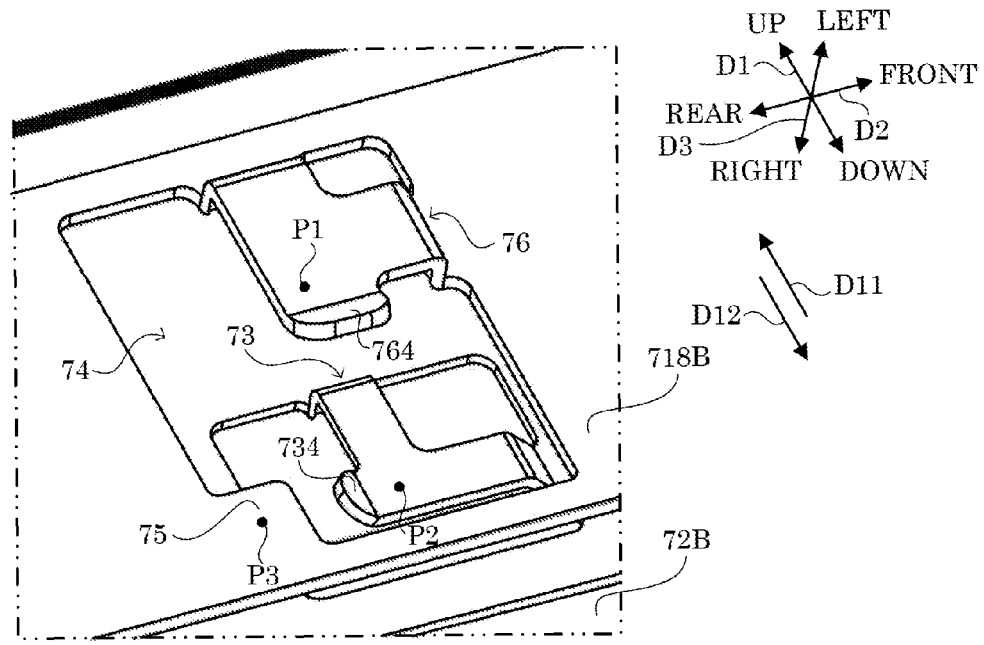
FIG. 9 is a diagram showing an attachment procedure to attach the lid portion of the shield case of the image forming apparatus according to the embodiment of the present disclosure.
Figure 10:
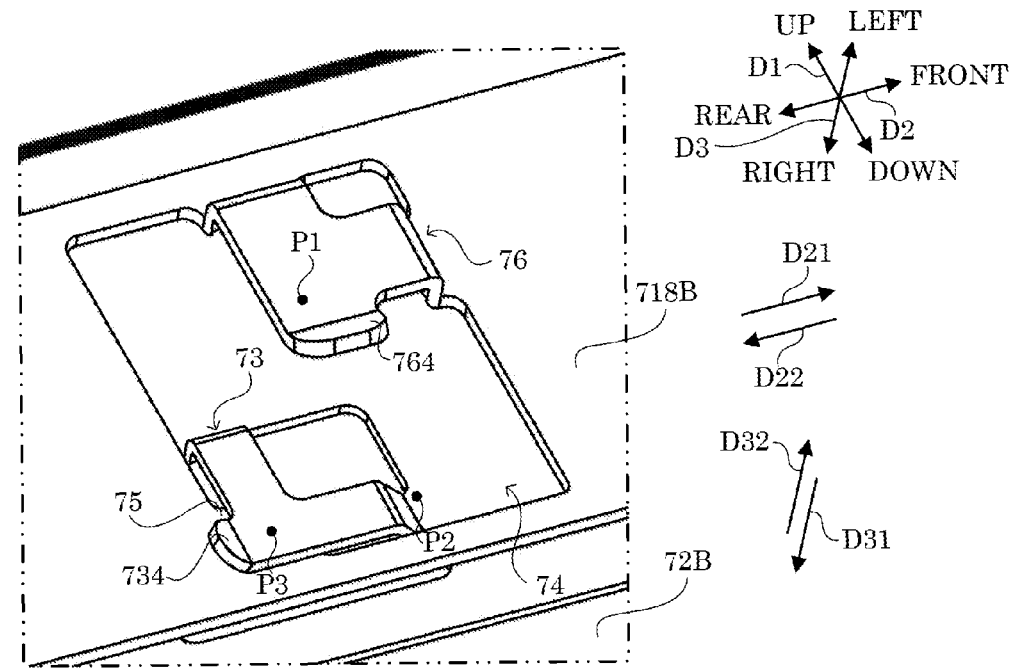
FIG. 10 is a diagram showing an attachment procedure to attach the lid portion of the shield case of the image forming apparatus according to the embodiment of the present disclosure.

The first claw portion 734, when the pressure contact portion 731 moves from an intermediate position P2 shown in FIG. 7 to the contact position P3, comes into contact with the second contact portion 75 and guides the pressure contact portion 731 to the contact position P3 (see FIG. 9 and FIG. 10). For example, as shown in FIG. 6, the first claw portion 734 is formed to incline from a forward end in the rearward direction D22 of the pressure contact portion 731, toward the leftward direction D32.

The opening portions 74 are provided in the lid support portions 716-719 in correspondence with the first contact portions 73. For example, in the image forming apparatus 10, as shown in FIG. 4, four opening portions 74 are provided in the lid support portion 718 in correspondence with the four first contact portions 73 provided in the upper edge portion of the rear surface 72B of the lid portion 72 (see FIG. 5). In addition, three opening portions 74 are provided in the lid support portion 716 in correspondence with the three first contact portions 73 provided in the lower edge portion of the rear surface 72B of the lid portion 72 (see FIG. 5).

Each of the opening portions 74 is formed with a size that allows the first contact portion 73 of the lid portion 72 to be inserted therein. For example, as shown in FIG. 7, the opening portion 74 is formed approximately in the shape of a rectangle. The opening portion 74 is provided with the second contact portion 75 and the pressurizing portion 76.

The second contact portion 75 is provided at an edge of the opening portion 74. For example, as shown in FIG. 7, the second contact portion 75 projects from the lower side and the rear side of the opening portion 74 to be a partial area of an edge portion of the opening portion 74.

When the lid portion 72 is attached to the main body portion 71, each of the first contact portions 73 comes into pressure contact with the second contact portion 75, and electrically connects the lid portion 72 and the main body portion 71. Specifically, when each of the first contact portions 73 moves in a direction perpendicular to the leftward direction D32 (see FIG. 4) in a state of being inserted in a corresponding opening portion 74, the first contact portion 73 is elastically deformed in the leftward direction D32 by contacting the second contact portion 75 and comes into pressure contact with the second contact portion 75. It is noted that the leftward direction D32 is perpendicular to the opening 7B, and is a direction in which the lid portion 72 is moved toward the main body portion 71 when the lid portion 72 is attached to the main body portion 71. In other words, the leftward direction D32 is an attachment direction of the lid portion 72 with respect to the main body portion 71. Here, the leftward direction D32 is an example of the attachment direction of the present disclosure, and is an example of the first direction.

Here, an attachment procedure to attach the lid portion 72 to the main body portion 71 is described with reference to FIG. 8 to FIG. 10. It is noted that in FIG. 8 to FIG. 10, the up-down direction D1, the front-rear direction D2, and the left-right direction D3 are indicated on a basis of the shield case 7 that is in a state of being attached to the image forming apparatus 10.

First, a worker who performs an attachment work of attaching the lid portion 72 to the main body portion 71, moves the lid portion 72 in the leftward direction D32 (see FIG. 8) with respect to the main body portion 71 attached to the frame 10A, and inserts each of the first contact portions 73 into an insertion position P1 in a corresponding opening portion 74. FIG. 8 shows a first contact portion 73 in a state of being inserted in the insertion position P1.

Next, the worker moves each first contact portion 73 from the insertion position P1 to the intermediate position P2 by moving the lid portion 72 along the downward direction D12 (see FIG. 9). FIG. 9 shows a first contact portion 73 in a state of having been moved to the intermediate position P2. Here, the downward direction D12 is an example of the third direction of the present disclosure.

Subsequently, the worker moves each first contact portion 73 from the intermediate position P2 to the contact position P3 by moving the lid portion 72 along the rearward direction D22 (see FIG. 10). During this process, the first contact portion 73 contacts the second contact portion 75 and is elastically deformed in the leftward direction D32. This allows the first contact portion 73 to contact the second contact portion 75 in a state of pressurizing the second contact portion 75 by the restoring force in a rightward direction D31 (see FIG. 10). FIG. 10 shows the first contact portion 73 in a state of having been moved to the contact position P3. Here, the rearward direction D22 is an example of the fourth direction of the present disclosure.

The pressure contact portion 731 is supported in two directions by the first support portion 732 and the second support portion 733. With this configuration, compared to a case where the pressure contact portion 731 is supported in one direction, the load applied to a portion of the first contact portion 73 that is elastically distorted, is distributed. As a result, the first contact portion 73 is restricted from being deformed due to reduction of strength by fatigue. It is noted that the second support portion 733 may not be provided in the first contact portions 73.

The first claw portion 734, when the first contact portion 73 moves from the intermediate position P2 to the contact position P3, comes into contact with a forward end in a frontward direction D21 of the second contact portion 75 (see FIG. 10) and guides the pressure contact portion 731 to the rear surface side of the second contact portion 75 (to the rear surface 718B side of the lid support portion 718). With this configuration, the movement of the first contact portion 73 from the intermediate position P2 to the contact position P3 is not interrupted by a contact with the second contact portion 75. It is noted that the first claw portions 734 may not be provided in the first contact portions 73.

With the configuration where the main body portion 71 and the lid portion 72 are electrically connected by the first contact portions 73 and the second contact portions 75, the noise radiated from the control portion 5 stored in the storage space 7A flows from the main body portion 71 and the lid portion 72 to the ground of the image forming apparatus 10 via the frame 10A. This restricts the noise radiated from the control portion 5 stored in the storage space 7A from leaking outside. In addition, the noise radiated from an external electronic device flows from the main body portion 71 and the lid portion 72 to the ground of the image forming apparatus 10 via the frame 10A. This makes it possible to protect the control portion 5 stored in the storage space 7A by shielding it from the noise radiated from an external electronic device.

It is noted that when the lid portion 72 is detached from the main body portion 71, the worker moves the first contact portions 73 from the contact positions P3 to the intermediate positions P2 by moving the lid portion 72 in the frontward direction D21 (see FIG. 10). Subsequently, the worker moves the first contact portions 73 from the intermediate positions P2 to the insertion positions P1 by moving the lid portion 72 in an upward direction D11 (see FIG. 9). The worker then pulls out of the first contact portions 73 from the insertion positions P1 to outside of the opening portions 74 by moving the lid portion 72 in the rightward direction D31 (see FIG. 8).

Meanwhile, a contact between the first contact portion 73 of the lid portion 72 and the second contact portion 75 of the main body portion 71 may become unstable due to the variation in part size. In addition, during an attachment/detachment of the lid portion 72, the first contact portion 73 may be deformed and a contact between the first contact portion 73 and the second contact portion 75 may become unstable. When the contact between the first contact portion 73 and the second contact portion 75 is unstable, the shielding function of the shield case 7 is reduced. On the other hand, as described below, in the image forming apparatus 10 according to the embodiment of the present disclosure, it is possible to stabilize the contact between the main body portion 71 and the lid portion 72.

The pressurizing portions 76 pressurize the first contact portions 73 inserted in the opening portions 74. Specifically, during a period from an insertion of the first contact portion 73 in the opening portion 74 until the first contact portion 73 contacts the second contact portion 75, the pressurizing portion 76 contacts and pressurizes the first contact portion 73 in the rightward direction D31 (see FIG. 8). Here, the rightward direction D31 is an example of the second direction of the present disclosure.

Each time the lid portion 72 is attached to the main body portion 71, the first contact portions 73 are pressurized by the pressurizing portions 76 in the rightward direction D31, and the attitude (the separation distance of the pressure contact portion 731 from the rear surface 72B of the lid portion 72, and the inclination angle of the pressure contact portion 731 with respect to the rear surface 72B of the lid portion 72) of the first contact portions 73 is corrected. This eliminates a variation in contact pressure of the first contact portions 73 to the second contact portions 75 that would occur due to a variation in part size. In addition, this eliminates a variation in contact pressure of the first contact portions 73 to the second contact portions 75 that would occur due to deformation of the first contact portions 73.

For example, the pressurizing portion 76 is provided at a position where it contacts the first contact portion 73 when the first contact portion 73 is inserted in the opening portion 74. Specifically, as shown in FIG. 7, the pressurizing portion 76 is provided at the insertion position P1. This makes it possible for the pressurizing portions 76 to pressurize the first contact portions 73 by using the force of the worker pressing the lid portion 72 toward the main body portion 71 when he/she inserts the first contact portions 73 in the opening portions 74. In addition, compared to a configuration where the pressurizing portion 76 is provided on a movement path of the first contact portion 73 between the insertion position P1 and the contact position P3, a path between the insertion position P1 and the pressurizing portion 76 is not required. This makes it possible to downsize the opening portions 74.

After being inserted in the opening portion 74, the first contact portion 73 moves downward and enters a state where the contact with the pressurizing portion 76 is released, and then moves in the rearward direction D22 and contacts the second contact portion 75. Specifically, as shown in FIG. 9, at the intermediate position P2, the first contact portion 73 is in a state where the contact with the pressurizing portion 76 is released. With the configuration where the first contact portion 73 moves from the insertion position P1 to the contact position P3 through a state where the contact of the first contact portion 73 with the pressurizing portion 76 is released, the first contact portion 73 can move smoothly to the contact position P3.

As another embodiment, each of the opening portions 74 may be elongated in the front-rear direction D2. With this configuration, after being inserted in the opening portion 74, the first contact portion 73 moves in the rearward direction D22 and contacts the second contact portion 75 through a state where the contact of the first contact portion 73 with the pressurizing portion 76 is released. In this case, the first contact portion 73 moves in one direction after being inserted in the opening portion 74. This simplifies the working process of the worker.

For example, as shown in FIG. 7, the pressurizing portion 76 includes a first pressurizing portion 761, a second pressurizing portion 762, a third pressurizing portion 763, and a second claw portion 764.

Figure 8:
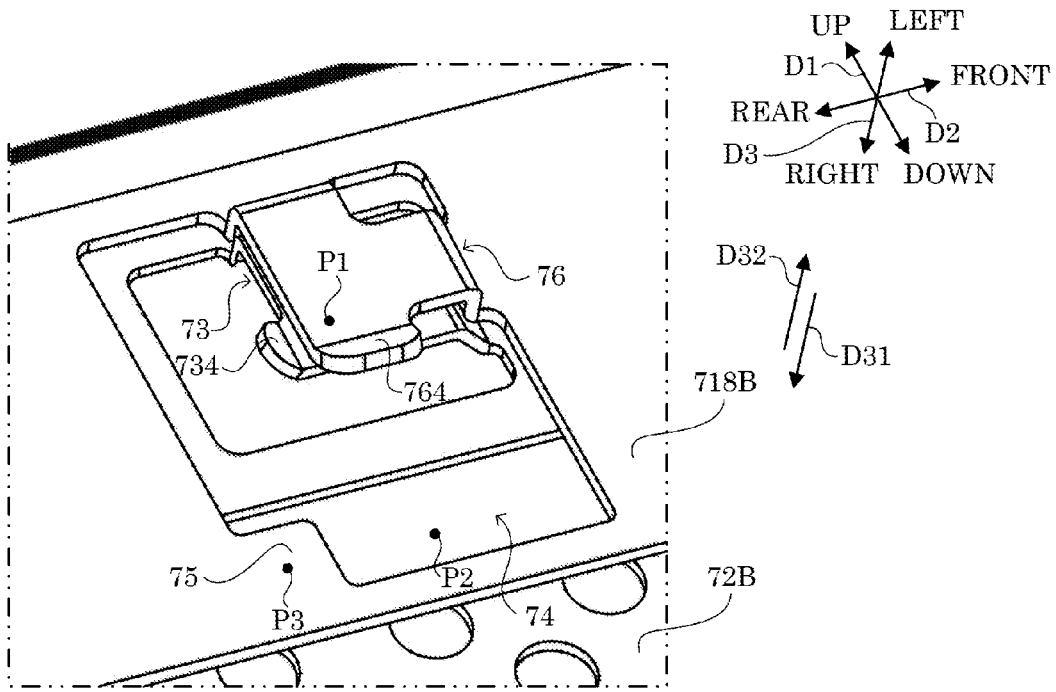
FIG. 8 is a diagram showing an attachment procedure to attach the lid portion of the shield case of the image forming apparatus according to the embodiment of the present disclosure.

The first pressurizing portion 761 is provided separated from the rear surface 718B of the lid support portion 718 by a predetermined second distance, and pressurizes the pressure contact portion 731 of the first contact portion 73 (see FIG. 8). It is noted that the second distance is set to an appropriate value so that the pressurizing force of the first pressurizing portion 761 to the pressure contact portion 731 has a desired strength.

As shown in FIG. 7, the second pressurizing portion 762 extends in the rearward direction D22 to support the first pressurizing portion 761, and pressurizes the first support portion 732 of the first contact portion 73. For example, the second pressurizing portion 762 projects from the rear surface 718B of the lid support portion 718, and then extends in the rearward direction D22 such that its extended end supports the first pressurizing portion 761.

As shown in FIG. 7, the third pressurizing portion 763 extends in the downward direction D12 to support the first pressurizing portion 761, and pressurizes the second support portion 733 of the first contact portion 73. For example, the third pressurizing portion 763 projects from the rear surface 718B of the lid support portion 718, and then extends in the downward direction D12 such that its extended end supports the first pressurizing portion 761.

The second claw portion 764, when the first contact portion 73 moves from the intermediate position P2 to the insertion position P1, contacts the second support portion 733 of the first contact portions 73 and guides the first contact portion 73 to the insertion position P1 (see FIG. 8 and FIG. 9). For example, as shown in FIG. 7, the second claw portion 764 is formed to incline from a forward end in the downward direction D12 of the first pressurizing portion 761, toward the leftward direction D32. With this configuration, the movement of the first contact portions 73 from the intermediate position P2 to the insertion position P1 is not interrupted by a contact with the pressurizing portion 76. It is noted that the second claw portion 764 may not be provided in the pressurizing portion 76.

As shown in FIG. 5, in the image forming apparatus 10, an insertion restricting portion 77 is provided on the rear surface 72B of the lid portion 72. The insertion restricting portion 77 restricts an insertion possible position where the first contact portion 73 can be inserted in the opening portion 74, to a predetermined position where the first contact portion 73 contacts the pressurizing portion 76 when the first contact portion 73 is inserted in the opening portion 74. For example, the insertion restricting portion 77 restricts the insertion possible position to the insertion position P1. Here, the insertion position P1 is an example of the predetermined position of the present disclosure.

For example, as shown in FIG. 5, the insertion restricting portion 77 includes a projection portion 771 and a forward end portion 772. The projection portion 771 projects from the rear surface 72B of the lid portion 72 in the left-right direction D3 in a bar shape. The forward end portion 772 is formed to spread from a projection end of the projection portion 771 in a direction perpendicular to a projection direction (the left-right direction D3) of the projection portion 771.

On the other hand, as shown in FIG. 4, in the image forming apparatus 10, a guide hole portion 78 is provided in the lid support portion 716 of the main body portion 71. The guide hole portion 78 is provided in correspondence with the insertion restricting portion 77 of the lid portion 72. For example, the guide hole portion 78 includes a first hole portion 781 and a second hole portion 782. The first hole portion 781 is formed with a size that allows the forward end portion 772 to be inserted therein at a position that faces the forward end portion 772 of the insertion restricting portion 77 when the first contact portion 73 is inserted in the insertion position P1 of the opening portion 74 in the lid support portion 716. The second hole portion 782 is formed to extend along a movement path in which the projection portion 771 moves when the first contact portion 73 moves from the insertion position P1 to the contact position P3. The second hole portion 782 is formed with a size that allows the projection portion 771 to be inserted therein and does not allow the forward end portion 772 to be inserted therein. This restricts the insertion possible position to the insertion position P1.

It is noted that a plurality of insertion restricting portions 77 may be provided on the rear surface 72B of the lid portion 72. In addition, the insertion restricting portion 77 may be provided on one or more lid support portions among the lid support portions 716-719 of the main body portion 71. In addition, the insertion restricting portion 77 may be provided on both of the main body portion 71 and the lid portion 72. Furthermore, in the image forming apparatus 10, the insertion restricting portion 77 and the guide hole portion 78 may not be provided.

As described above, the shield case 7 includes the pressurizing portion 76 that contacts and pressurizes the first contact portion 73 during a period from an insertion of the first contact portion 73 in the opening portion 74 until the first contact portion 73 contacts the second contact portion 75. With this configuration, each time the lid portion 72 is attached to the main body portion 71, the first contact portions 73 are pressurized, and the attitude of the first contact portions 73 is corrected. As a result, in the image forming apparatus 10, it is possible to stabilize the contact between the main body portion 71 of the shield case 7 and the lid portion 72.

It is noted that in the shield case 7, the first contact portions 73 may be provided in the main body portion 71, and the opening portions 74, the second contact portions 75, and the pressurizing portions 76 may be provided in the lid portion 72. In this case, the first contact portions 73 are elastically deformed in the rightward direction D31 and contact the second contact portions 75, and the pressurizing portions 76 pressurize the first contact portions 73 in the leftward direction D32. Here, the rightward direction D31 is another example of the first direction of the present disclosure. In addition, the leftward direction D32 is another example of the second direction of the present disclosure.

The shield structure of the present disclosure may include the frame 10A. For example, a configuration having the frame 10A, the side wall portions 712-715 of the main body portion 71, the lid support portions 716-719, and the lid portion 72, is another example of the shield structure of the present disclosure.

It is to be understood that the embodiments herein are illustrative and not restrictive, since the scope of the disclosure is defined by the appended claims rather than by the description preceding them, and all changes that fall within metes and bounds of the claims, or equivalence of such metes and bounds thereof are therefore intended to be embraced by the claims.

The invention claimed is:

1. A shield structure comprising:
   a main body portion which is conductive and in which an electronic circuit is stored; and
   a lid portion which is conductive and attached to the main body portion in a detachable manner, wherein
   one of the main body portion and the lid portion includes a first contact portion, and the other includes an opening portion, a second contact portion, and a pressurizing portion, wherein the first contact portion can be inserted in the opening portion, the second contact portion is provided in an edge portion of the opening portion, and the pressurizing portion is configured to pressurize the first contact portion inserted in the opening portion,
   when the first contact portion moves in a direction perpendicular to an attachment direction of the lid portion attached to the main body portion, in a state of being inserted in the opening portion, the first contact portion is elastically deformed in a first direction by contacting the second contact portion and comes into pressure contact with the second contact portion, and
   during a period from an insertion of the first contact portion in the opening portion until the first contact portion contacts the second contact portion, the pressurizing portion contacts and pressurizes the first contact portion in a second direction that is opposite to the first direction.

2. The shield structure according to claim 1, wherein
the pressurizing portion is provided at a position where the pressurizing portion contacts the first contact portion when the first contact portion is inserted in the opening portion, and
the first contact portion, after being inserted in the opening portion, moves in a third direction perpendicular to the attachment direction and enters a state where a contact with the pressurizing portion is released, and then moves in a fourth direction that is perpendicular to the attachment direction and different from the third direction, and contacts the second contact portion.

3. The shield structure according to claim 1, wherein
the pressurizing portion is provided at a position where the pressurizing portion contacts the first contact portion when the first contact portion is inserted in the opening portion, and
the first contact portion, after being inserted in the opening portion, moves in a fourth direction perpendicular to the attachment direction and contacts the second contact portion through a state where a contact of the first contact portion with the pressurizing portion is released.

4. The shield structure according to claim 2, wherein
an insertion restricting portion is included in one or both of the main body portion and the lid portion, wherein the insertion restricting portion is configured to restrict an insertion possible position where the first contact portion can be inserted in the opening portion, to a predetermined position where the first contact portion contacts the pressurizing portion when the first contact portion is inserted in the opening portion.

5. The shield structure according to claim 2, wherein
the first contact portion includes a pressure contact portion, a first support portion, and a second support portion, wherein the pressure contact portion is provided separated from the main body portion or the lid portion by a predetermined first distance and comes into pressure contact with the second contact portion, the first support portion extends in the fourth direction and supports the pressure contact portion, and the second support portion extends in a fifth direction that is perpendicular to the attachment direction and intersects with the fourth direction, and supports the pressure contact portion.

6. An electronic device comprising:
the shield structure according to claim 1; and
the electronic circuit.

* * * * *